United States Patent [19]
Britten

[11] Patent Number: 5,660,642
[45] Date of Patent: Aug. 26, 1997

[54] MOVING ZONE MARANGONI DRYING OF WET OBJECTS USING NATURALLY EVAPORATED SOLVENT VAPOR

[75] Inventor: Jerald A. Britten, Oakley, Calif.

[73] Assignee: The Regents of the University of California, Oakland, Calif.

[21] Appl. No.: 451,316

[22] Filed: May 26, 1995

[51] Int. Cl.$^6$ ........................................ B08B 3/00
[52] U.S. Cl. ................... 134/30; 134/31; 134/32; 134/64 R; 134/122 R; 134/902
[58] Field of Search .................. 156/639.1; 216/57, 216/91, 92; 134/64 R, 64 P, 122 R, 122 P, 94.1, 95.2, 30–32, 902

[56] References Cited

U.S. PATENT DOCUMENTS

| | | | |
|---|---|---|---|
| 3,597,289 | 8/1971 | Köhl et al. | 156/640.1 |
| 4,541,568 | 9/1985 | Lichfield | 239/441 |
| 4,781,764 | 11/1988 | Leenaars | 134/34 |
| 4,788,992 | 12/1988 | Swainbank et al. | 134/64 R |
| 4,984,597 | 1/1991 | McConnell et al. | 134/95.2 |
| 5,055,138 | 10/1991 | Slinn | 134/902 |
| 5,183,067 | 2/1993 | Slinn | 134/61 |
| 5,243,768 | 9/1993 | Fukao et al. | 34/22 |
| 5,333,628 | 8/1994 | Ogata et al. | 134/64 R |
| 5,335,681 | 8/1994 | Schmid | 134/64 R |
| 5,339,842 | 8/1994 | Bok | 134/1 |
| 5,351,419 | 10/1994 | Franka et al. | 34/470 |
| 5,371,950 | 12/1994 | Schumacher | 34/78 |
| 5,437,733 | 8/1995 | Okumura | 134/122 R |
| 5,520,744 | 5/1996 | Fujikawa et al. | 134/95.2 |
| 5,571,337 | 11/1996 | Mohindra et al. | 134/25.4 |

OTHER PUBLICATIONS

Anonymous, "Drying of Substrates after Treatment in a Liquid" Research Disclosure 32778 Jul. 1991.

Wolke et al, "Marangoni wafer drying avoids disadvantages" Solid State Tech. pp. 87–90 Aug. 1996.

Marra, J., Mittal, K.L., ed. "Ultraclean Marangoni Drying" Particles in Gases and Liquids 3: Detection, Characterization, and Control, Plenum Press, NY 1993.

O'Brien, S.B.G.M. "On Marangoni Drying" J. Fluid Mech. vol.254, pp. 649–670 1993.

Marra, J. et al "Physical Principles of Marangoni Drying" Langmuir (7), pp. 2748–2755 1991.

Huethorst, J.A.M. et al "Motion of Marangoni–Contracted Water Drops Across Inclined Hydrophilic Surfaces" Langmuir (7) pp. 2756–2763 1991.

Schild, R. et al "Marangoni Drying: A New Concept for Drying Silicon Wafers" Proceedings of the Second International Symposium on Ultra–Clean Processing of Silicon Surfaces (UCPSS '94) Heyns, M.M., ed. pp. 31–34 Sep. 1994.

Leenaars, et al., Marangoni Drying: A New Extremely Clean Drying Process; Langmuir, vol. 6, No. 11, 1990, pp. 1701–1703.

Primary Examiner—Robert Kunemund
Assistant Examiner—Anita Alanko
Attorney, Agent, or Firm—Henry P. Sartorio; John P. Wooldridge

[57] ABSTRACT

A surface tension gradient driven flow (a Marangoni flow) is used to remove the thin film of water remaining on the surface of an object following rinsing. The process passively introduces by natural evaporation and diffusion of minute amounts of alcohol (or other suitable material) vapor in the immediate vicinity of a continuously refreshed meniscus of deionized water or another aqueous-based, nonsurfactant rinsing agent. Used in conjunction with cleaning, developing or wet etching application, rinsing coupled with Marangoni drying provides a single-step process for 1) cleaning, developing or etching, 2) rinsing, and 3) drying objects such as flat substrates or coatings on flat substrates without necessarily using heat, forced air flow, contact wiping, centrifugation or large amounts of flammable solvents. This process is useful in one-step cleaning and drying of large flat optical substrates, one-step developing/rinsing and drying or etching/rinsing/drying of large flat patterned substrates and flat panel displays during lithographic processing, and room-temperature rinsing/drying of other large parts, sheets or continuous rolls of material.

33 Claims, 3 Drawing Sheets

MOVING ZONE MARANGONI DRYING OF WET OBJECTS USING NATURALLY EVAPORATED SOLVENT VAPOR

The United States Government has rights in this invention pursuant to Contract No. W-7405-ENG-48 between the United States Department of Energy and the University of California for the operation of Lawrence Livermore National Laboratory.

BACKGROUND OF THE INVENTION

1. Field of the Invention

The present invention relates to the aqueous processing of the surfaces of large, flat or nearly flat objects, and more specifically, it relates to the use of the Marangoni effect in processing such substrates.

2. Description of Related Art

Cleaning the surfaces of large parts is a critical processing step in many industrial operations. Also, developing of photoresist and wet etching are essential steps during processing of large flat optics, silicon wafers and flat panel display substrates. Rinsing and drying are essential follow-up steps. Aqueous-based agents are necessary for some of these steps and are desirable overall for cleaning due to the problems associated with flammable and hazardous solvents. Drying of water films remaining from the rinse step is problematic without resorting to heat and turbulent gas flow, and these drying processes can leave behind residues.

The cleaning of objects in critical applications is often accomplished by ultrasonic energy or megasonic energy incident on the surface of the object contacted by a liquid medium. An example of an ultrasonic cleaning device is disclosed in U.S. Pat No. 4,788,992. An example of a megasonic cleaning device is disclosed in U.S. Pat. No. 5,339,842. The former invention utilizes an air knife to dry parts after the cleaning operation, while the latter invention does not discuss the drying operation. Both processes would benefit by utilizing Marangoni drying as put forth in this application. The drying of semiconductor wafers and flat panel substrates is often accomplished by centrifugation. This method becomes unwieldy for large substrates and is known to generate particles which can contaminate the surface being dried.

Another class of drying apparatus for semiconductor substrates is known as vapor dryers. Examples of such systems are U.S. Pat. Nos. 5,371,950, 5,351,419, 5,243,768 and 5,183,067. In these units, vapor from a solvent such as isopropanol or a fluorinated liquid is introduced in the vicinity of a substrate and condenses on the substrate, flushing the original liquid on the substrate. The condensate is then caused to flash evaporate from the part, leaving it dry. Such processing units require large amounts of organic and/or flourinated solvents, heating and cooling modules, and elaborate solvent recycling equipment. They are not conducive to in-situ cleaning and drying of an object as part of an integrated process unit. A Marangoni drying process has been described (Leenaars, et al., Langmuir, 6, 1701, 1990) in which a nitrogen gas flow containing solvent vapors is blown onto a part which is being withdrawn from a quiescent reservoir of water. This apparatus demonstrates the principle of Marangoni drying, but is limited in practice by drying nonuniformities on large-area surfaces due to nonuniformity of vapor impingement on the surface, and by lack of water flow near the three-phase contact line to maintain a strong, one-dimensional surface tension gradient. The prior art methods have been nominally effective; however, there is still a need for improvements in the drying of the substrates. These improvements are needed to reduce processing steps and production costs, and to provide uniform drying and a higher degree of cleanliness during the drying operation.

SUMMARY OF THE INVENTION

It is an object of the present invention to provide an apparatus and method for contactless drying in which a surface tension gradient driven flow is used to dry the surface of an object during a rinsing operation.

It is a further object of the invention to provide single step cleaning, developing or etching, rinsing and drying of object surfaces such as substrates or coatings on substrates.

Marangoni drying is a process whereby the passive introduction (by natural evaporation and diffusion of vapors) of surface tension-reducing volatile organic compounds (voc's) in the vicinity of the meniscus of a thin film of water adhering to a solid substrate in motion relative to the source of water, will result in surface tension gradients which cause the thin water film to flow off of the substrate, leaving it dry. This invention is an apparatus and process ideal for flat objects in which the processing (including but not limited to cleaning, developing or etching), rinsing and drying take place simultaneously as a substrate is moved relative to the processing units performing the above functions. Thus, up to three processing steps are combined into one and aqueous-based agents are used along with a minute amount of an organic liquid that has the following properties: it has an adequate vapor pressure at room temperature, it is water soluble and produces a large reduction in the surface tension of water when dissolved in minute concentrations. Ethyl or isopropyl alcohol are such materials and are of a relatively minor hazard.

In the contactless drying process of this invention, a surface tension gradient driven flow (a Marangoni flow) is used to remove the thin film of water remaining on the surface of an object following rinsing. The process passively introduces minute amounts of alcohol (or other suitable material) vapor in the immediate vicinity of a continuously refreshed meniscus of deionized water or another aqueous-based, nonsurfactant rinsing agent. Used in conjunction with cleaning, developing or wet etching application, rinsing coupled with Marangoni drying provides a single-step process for 1) cleaning, developing or etching, 2) rinsing, and 3) drying objects such as flat substrates or coatings on flat substrates without necessarily using heat, forced air flow, contact wiping, centrifugation or large amounts of flammable solvents. This process is useful in one-step cleaning and drying of large flat optical substrates, one-step developing/rinsing and drying or etching/rinsing/drying of large flat patterned substrates and flat panel displays during lithographic processing, and room-temperature rinsing/drying of other large parts, sheets or continuous rolls of material.

DETAILED DESCRIPTION OF THE INVENTION

Figure 1:
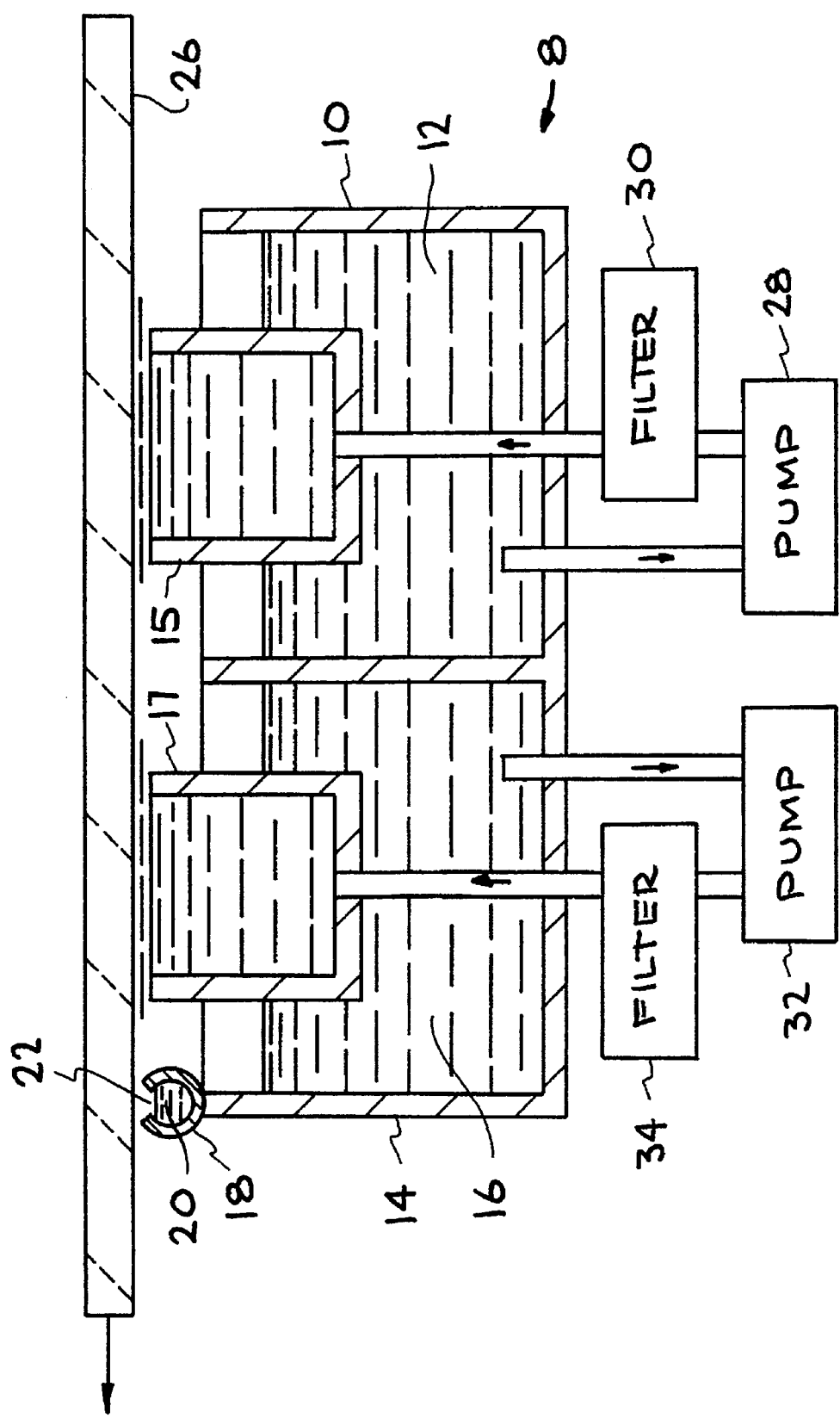
FIG. 1 shows a cross-sectional view of an embodiment of an applicator assembly for simultaneous processing, rinsing and drying of a face-down substrate.

Referring to FIG. 1, an applicator assembly 8 comprising a processing applicator 10 containing the processing fluid 12 along with possibly cleaning agents such as brushes, ultrasonic transducers, etc., in an arrangement similar to wave coating or meniscus coating, is packaged with a rinse applicator 14 containing pure rinse water 16. In applicator assembly 8, both processing applicator 10 and rinse applicator 14 comprise internal assembly 15 and 17 respectively. Along the back side of the rinse applicator 14 is a small reservoir 18 containing a few milliliters of isopropanol 20 or other suitable material, either in a pool or saturating a porous medium. An opening or slit 22 along the top of reservoir 18 allows evaporated solvent 20 to diffuse out from the solvent pool. Slit 22 is placed in close proximity to the edge of the rinse applicator 14. The applicator assembly 8 comprises processing applicator 10 and rinse applicator 14, and is placed in close proximity to an inverted substrate surface 26 to be processed, such that the processing fluid 12 and the rinse water 16 both attach to the inverted substrate surface 26, forming menisci. The applicator assembly 8 is then translated relative to the substrate surface 26 such that an area on the substrate is first contacted by the processing fluid 12 and then the rinse water 16. Process applicator 10 typically has a pump 28 and a filter 30. Similarly, the rinse applicator usually has a pump 32 and a filter 34.

Figure 2:
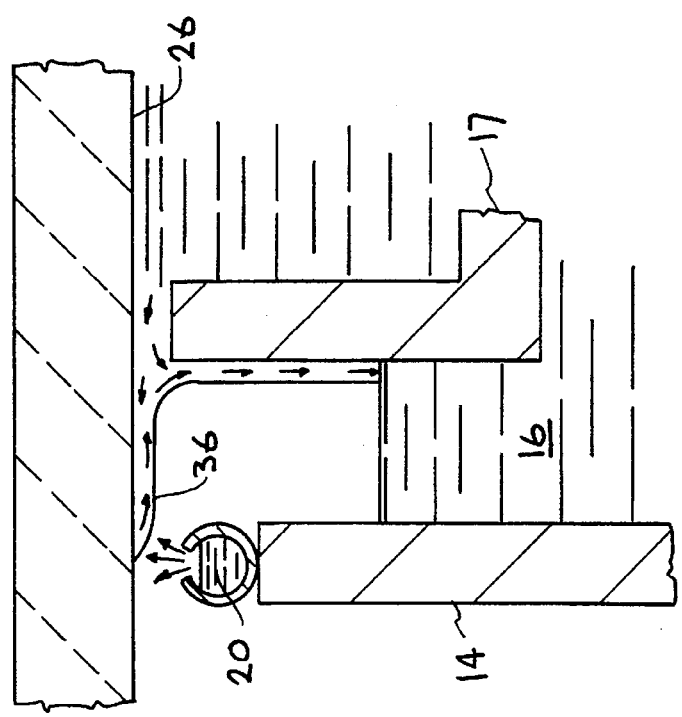
FIG. 2 shows a more detailed view of the applicator and process of FIG. 1.

FIG. 2 shows the trailing edge of the applicator assembly 8 where a thin film 36 of rinse water 16 is left behind. Evaporated solvent 20 absorbs into thin film 36, causing a local lowering of the surface tension here. This surface tension gradient induces the liquid film to flow back to the rinse applicator 14, thus pulling the thin film 36, as well as any dissolved substances or microscopic particles that may be loose but entrained in the film, back to the bulk of rinse water 16. This surface-tension gradient driven flow is often called a Marangoni flow. This lateral film flow results in the substrate 26 being completely dry within several millimeters back from the trailing edge of the rinse water meniscus, and as a result, the substrate 26 is processed, rinsed and dried in one step. The rinse water 16 very slowly accumulates dissolved solvent 20, but can remain viable for very many processing steps since the concentration of solvent 20 in the bulk liquid builds very slowly, while the concentration in the very thin water film directly above the solvent vapor source is always relatively high.

Figure 3:
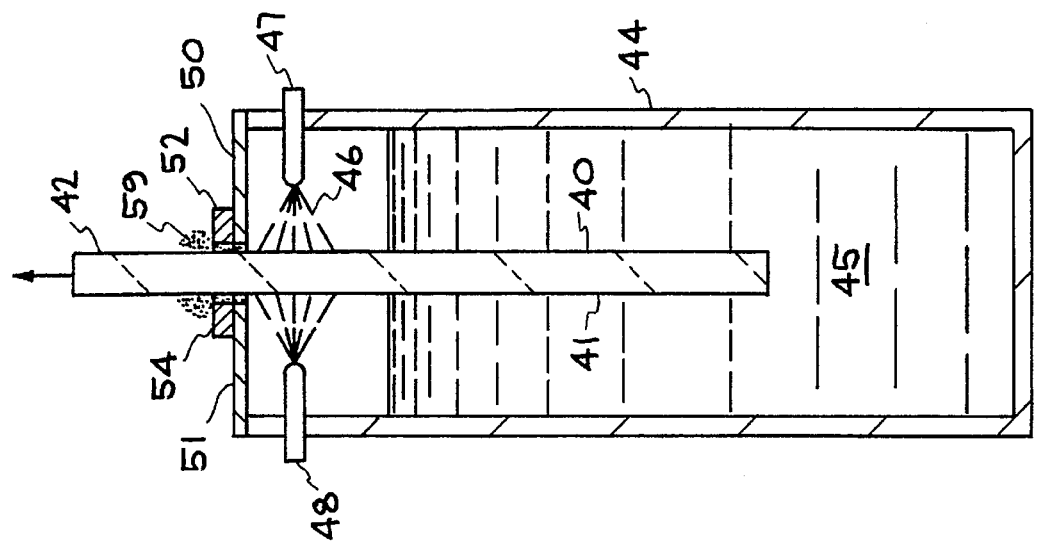
FIG. 3 shows an embodiment for Marangoni drying during aqueous processing of both sides of a substrate.

FIG. 3 shows Marangoni drying during aqueous processing of both sides 40, 41 of substrate 42 being withdrawn in a vertical position from processing fluid 45 within processing tank 44. Marangoni drying is enabled by pulling the substrate out of a processing tank into a zone where deionized water 46 is sprayed from spray nozzles 47, 48, or otherwise introduced to irrigate both sides of the substrate and the lower surfaces of a thin barrier or splash plate 50,51. This splash plate is a few millimeters thick and its edge is positioned to be within a millimeter or two from the surface of the substrate being rinsed. Attached to the upper surface of the splash plate 50,51 on either side is a porous medium 52, 54, or other solvent vapor source saturated with isopropanol or another suitable solvent. As the substrate is withdrawn, some of the naturally evaporated solvent vapors 59 again absorb into the entrained liquid film and cause it to flow off of the substrate back into the bulk of processing fluid 45 within processing tank 44, leaving the substrate 42 dry upon clearance from the immediate vicinity of the top of the processing tank 44.

Figure 4:
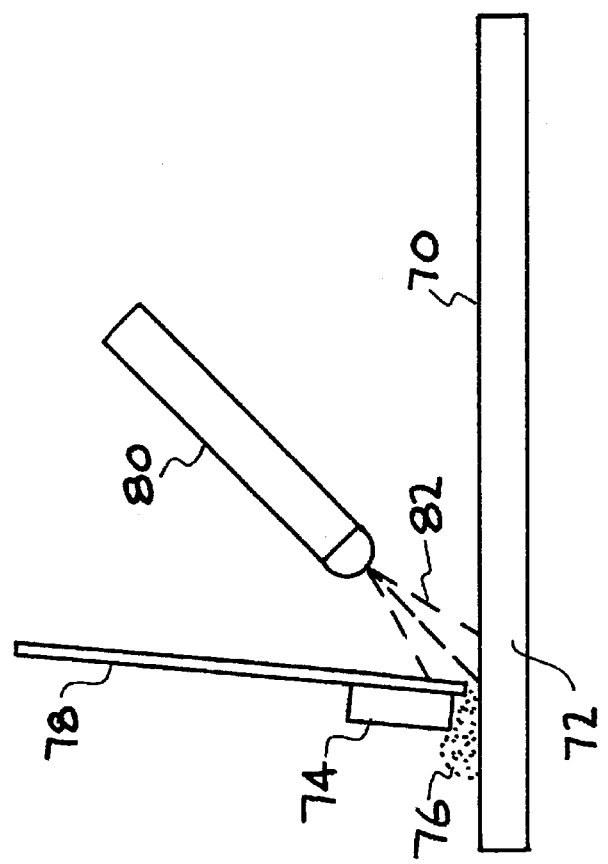
FIG. 4 shows an embodiment for rinsing and drying in which the substrate surface to be processed is facing up

Referring to FIG. 4, the surface 70 of the substrate 72 to be rinsed is lying face-up, or at an angle between vertical and horizontal inclusively, while in relative motion to an assembly containing a vapor source 74 of solvent vapor 76, as described above, on one side of a splash plate 78, while on the other side, a nozzle 80 sprays deionized rinse water 82 down upon the surface 70 of substrate 72 and the underside of the splash plate 78. The solvent vapor 76 causes the entrained film on the surface 70 to flow back at a rate balanced by the forward rate of the substrate 72, so that the liquid contact line on the substrate appears stationary and the surface 70 is dry underneath and to the left of the vapor source 74. The splash plate is placed so that its end is a millimeter or two up from the surface of the substrate. The apparatus consisting of the spray nozzle 80 or other water source, the splash plate 78, and solvent vapor reservoir 74 can be hand-held or part of an automated assembly.

Figure 5:
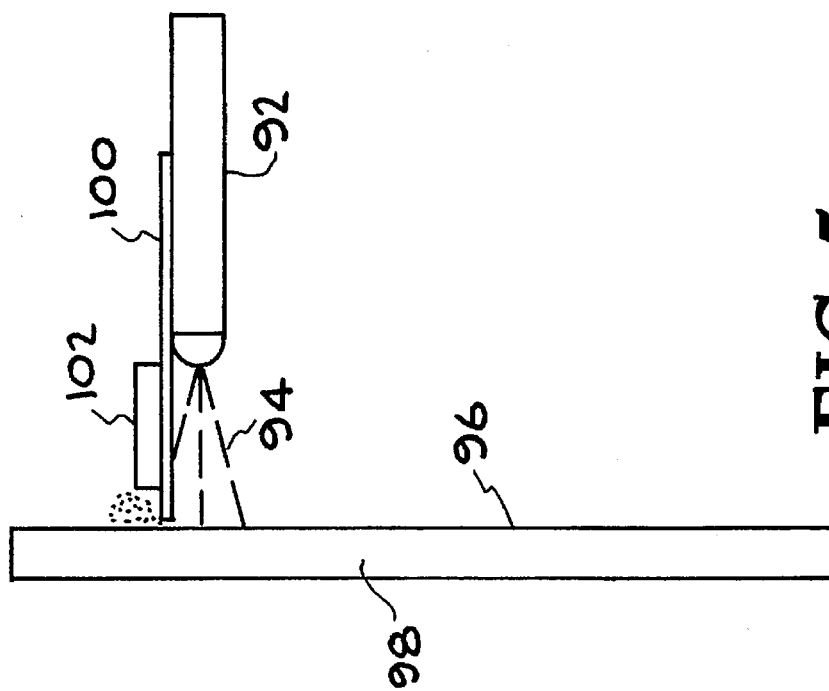
FIG. 5 shows a hand held unit for Marangoni drying of a surface.

Passive introduction (by natural evaporation and diffusion of vapors) of surface tension-reducing volatile organic compounds (voc's) in the vicinity of the meniscus of a thin film of water adhering to a solid substrate in motion relative to the source of water, will result in surface tension gradients which cause the thin water film to flow off of the substrate, leaving it dry. This drying process is contactless and is in principle cleaner than other methods which use forced air, heat, or centrifugation, in that the water film flows off of the substrate and does not evaporate. Thus, dissolved solids and small particulates flow off as well and are not deposited as in an evaporative process. The drying process can be incorporated into an aqueous processing system to provide a one-step processing, rinsing and drying process unit. The processing step can include but is not limited to cleaning (ultrasonic, megasonic or brush), photoresist development or wet etching. Such a process can be employed as an in-situ point-of-use cleaning step prior to coating or other processing. A rinsing/drying assembly utilizing Marangoni drying as described above can be part of an automated cleaning unit or a handheld unit for manual processing. FIG. 5 shows a hand held Marangoni drying unit wherein a nozzle 92 sprays deionized rinse water 94 onto surface 96 of substrate 98. Nozzle 92 is attached to splash plate 100. Solvent vapor source 102 is attached to splash plate 100 on a side opposite from nozzle 92.

Negligible amounts of voc's are released during this process, and the vapor source can be covered, sealed or removed when not in use. Pure deionized water is used as the rinse agent. The process does not introduce the substrate to heat or potential contamination due to forced air flow. Nor are centrifugation or other particle-generating motions employed. It can be used on any substrate that is not adversely affected by contact with water. Substrates can include but are not limited to large silicon wafers, flat panel display substrates, large optics, metal sheets, etc. The substrate to be dried can be in an inverted (face down) position, vertically oriented, or in a face-up position. A means of continuous fresh water conveyance to the region of the meniscus is required to maintain a strong, one-dimensional surface tension gradient. Such a supply can be realized by use of pumping, flushing or spraying fresh or recirculated water to the immediate vicinity of the meniscus. Uniform and constant irrigation in the immediate vicinity of the meniscus is essential for the successful operation of Marangoni drying.

The volatile organic compound (voc) vapor source can be a pool of liquid or a saturated porous material such as a sponge. The voc can be any compound which has an appreciable vapor pressure at room temperature, is water soluble, and has the effect that small amounts dissolved in water significantly reduce the water surface tension. Examples of suitable voc's of relatively minor hazard include isopropanol and ethanol. To implement the Marangoni drying, the substrate can be moved relative to a stationary source of water forming the meniscus, or the source of water can be moved relative to a stationary substrate, or both can be in relative motion.

Changes and modifications in the specifically described embodiments can be carried out without departing from the scope of the invention, which is intended to be limited by the scope of the appended claims.

I claim:

1. A method for processing, cleaning and drying the surface of an object, comprising:

applying rinsewater to said surface of said object, wherein said rinsewater is applied in a manner such that a rinsewater applicator is moved relative to said object and the majority of said rinsewater drains away from said object, but a small portion remains behind as a thin liquid film; and passively applying a solvent vapor from a solvent vapor source to said liquid film by natural evaporation and diffusion of the solvent vapor, wherein said solvent vapor causes a lowering of the surface tension of said liquid film, wherein a resulting surface tension gradient induces said liquid film and any dissolved material and loose microscopic particles entrained in said liquid film to flow off of said object and becomes incorporated into the majority of said rinsewater that drains away from said object, leaving said surface of said object clean and dry.

2. The method of claim 1 further comprising the step of moving said object at a rate wherein vapor from said solvent vapor source causes said liquid film to flow away from said object according to a Marangoni flow, wherein a liquid contact line on said object remains stationary with respect to said solvent vapor source.

3. A method for cleaning and drying the surface of an object, comprising:

applying rinsewater to the surface of said object with a handheld applicator containing a solvent vapor source mounted in proximity so as to affect Marangoni drying by passively applying a solvent vapor by natural evaporation and diffusion of the solvent vapor;

positioning said handheld device a precise distance from the surface to be rinsed and dried; and moving said handheld device from top to bottom of the surface of said object to be rinsed and dried, to allow the Marangoni effect in conjunction with gravity-driven flow to dry the surface of said object.

4. An apparatus for rinsing and drying the surface of an object, comprising:

means for applying rinsewater to said surface of said object, wherein said rinsewater is applied in a manner such that a rinsewater applicator is moved relative to said surface of said object and the majority of said rinsewater drains away from said object, but a small portion remains behind as a thin liquid film and means for passively applying a solvent vapor to said liquid film by natural evaporation and diffusion of the solvent vapor, wherein said solvent vapor causes a lowering of the surface tension of said liquid film, wherein a resulting surface tension gradient induces said liquid film and dissolved material and loose microscopic particles entrained in said liquid film to flow off of said object and become incorporated into the majority of said rinsewater that drains away from said object.

5. The apparatus of claim 4, wherein said means for applying rinsewater comprise a rinsewater applicator having a trailing edge, which moves relative to said surface, such that the entire surface is wetted, and a thin water film remains on the surface at the trailing edge, with the remaining rinsewater draining away from said surface.

6. The apparatus of claim 4, wherein said means for passively applying a solvent comprise a solvent vapor source.

7. The apparatus of claim 4, wherein said solvent vapor source comprises a reservoir fixedly attached to said trailing edge.

8. The apparatus of claim 4, wherein said solvent comprises a low molecular weight alcohol.

9. The apparatus of claim 4, wherein said solvent is selected from a group consisting of isopropanol and ethanol.

10. The apparatus of claim 4, wherein said solvent comprises water soluble compounds.

11. The apparatus of claim 4, wherein low concentrations of said water soluble compounds have a strong negative influence on the surface tension of said rinsewater.

12. The apparatus of claim 4, further comprising a pool of solvent within said reservoir.

13. The apparatus of claim 6, further comprising a porous medium within said reservoir, which acts to confine the solvent source (liquid) to the physical volume of said porous medium by means of capillary (surface tension) forces, allowing any orientation of the apparatus without concerns of gravity drainage of said liquid.

14. The apparatus of claim 7, wherein said solvent reservoir comprises an opening facing the object to be dried to allow escape of passively evaporated solvent.

15. The apparatus of claim 4, wherein said means for applying rinsewater comprise at least one spray nozzle connected by water hose to a filter and a pump.

16. The apparatus of claim 4, if wherein said means for applying rinsewater comprise an irrigation source connected by water hose to a filter and a pump.

17. The apparatus of claim 4, wherein said means for applying rinsewater comprise at least one spray nozzle connected by water hose to a filter and a pressurized water reservoir.

18. The apparatus of claim 4, wherein said means for applying rinsewater comprise an irrigation source connected by water hose to a filter and a pressurized water reservoir.

19. The apparatus of claim 4, wherein said means for applying rinsewater and solvent vapors to implement Marangoni drying are part of an automated assembly.

20. The apparatus of claim 4, wherein said means for applying rinsewater and solvent vapors to implement Marangoni drying are part of a handheld device.

21. The apparatus of claim 14, wherein said opening comprises a slit.

22. The apparatus of claim 21, wherein said slit is placed in close proximity to said trailing edge of said rinsewater applicator.

23. The apparatus of claim 5, wherein said rinsewater comprises deionized water.

24. The apparatus of claim 4, further comprising a barrier placed between said means for passively applying a solvent vapor and said means for applying rinsewater.

25. The apparatus of claim 24, wherein said barrier is about 3 millimeters thick.

26. The apparatus of claim 24, wherein an edge of said barrier is about a millimeter from said surface of said object.

27. The apparatus of claim 4, wherein said surface is facing up.

28. The apparatus of claim 4, wherein said surface is facing at an angle between vertical and horizontal inclusively.

29. The apparatus of claim 4, further comprising means for sealing said vapor source.

30. The apparatus of claim 4, wherein said object is selected from a group consisting of silicon wafers, flat panel display substrates, optics, metal sheets and plastic sheets.

31. The apparatus of claim 20, wherein said means for applying rinsewater include means for issuing a linear stream of water, wherein said means for issuing a linear stream of water consist of a slit and a linear array of spray nozzles for linear irrigation of a substrate to be rinsed and dried.

32. The apparatus of claim 20, wherein said means for passively applying a solvent comprise a solvent vapor source, wherein said solvent vapor source is mounted to the upper side of said handheld device.

33. The apparatus of claim 20, wherein said means for passively applying a solvent comprise a solvent vapor source, said apparatus further comprising means for standing off said rinsewater stream and said vapor source a precise and small distance from said object.

* * * * *